United States Patent
Basceri (10) Patent No.: US 7,217,617 B2
(45) Date of Patent: *May 15, 2007

(54) METHODS OF FORMING A CAPACITOR

(75) Inventor: Cem Basceri, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 53 days.

This patent is subject to a terminal disclaimer.

(21) Appl. No.: 11/112,127

(22) Filed: Apr. 22, 2005

(65) Prior Publication Data

US 2005/0186688 A1    Aug. 25, 2005

Related U.S. Application Data

(63) Continuation of application No. 10/875,381, filed on Jun. 25, 2004, now Pat. No. 6,884,475, which is a continuation of application No. 09/580,733, filed on May 26, 2000, now abandoned.

(51) Int. Cl.
*H01L 21/8242* (2006.01)

(52) U.S. Cl. ............... 438/240; 438/239; 438/785

(58) Field of Classification Search ........... 438/240, 438/239, 785
See application file for complete search history.

(56) References Cited

U.S. PATENT DOCUMENTS

| | | | |
|---|---|---|---|
| 4,105,810 A | 8/1978 | Yamazaki et al. | |
| 4,261,698 A | 4/1981 | Carr et al. | |
| 4,691,662 A | 9/1987 | Roppel et al. | |
| 5,006,363 A | 4/1991 | Fujii et al. | |
| 5,164,363 A | 11/1992 | Eguchi et al. | |
| 5,183,510 A | 2/1993 | Kimura | |

(Continued)

FOREIGN PATENT DOCUMENTS

EP    0030798    6/1981

(Continued)

OTHER PUBLICATIONS

T. Aoyama et al., *Leakage current Mechanism of Amorphous and Polycrystalling $Ta_2O_5$ Films Grown by Chemical Vapor Deposition*, J. Electrochem. Soc., vol. 143, No. 3, pp. 977-983 (Mar. 1996).

(Continued)

*Primary Examiner*—Michael Trinh
(74) *Attorney, Agent, or Firm*—Wells St. John P.S.

(57) ABSTRACT

A method of forming a capacitor having a capacitor dielectric layer comprising $ABO_3$, where "A" is selected from the group consisting of Group IIA and Group IVB metal elements and mixtures thereof, where "B" is selected from the group consisting of Group IVA elements and mixtures thereof, includes feeding a plurality of precursors comprising A, B and O to a chamber having a substrate positioned therein under conditions effective to chemical vapor deposit an $ABO_3$-comprising dielectric layer over the substrate. During the feeding, pressure within the chamber is varied effective to produce different concentrations of B at different elevations in the deposited layer and where higher comparative pressure produces greater concentration of B. The $ABO_3$-comprising dielectric layer is incorporated into a capacitor, with the $ABO_3$-comprising dielectric layer comprising a capacitor dielectric layer of the capacitor and having a dielectric constant k of at least 20 in the capacitor.

42 Claims, 4 Drawing Sheets

U.S. PATENT DOCUMENTS

| | | | |
|---|---|---|---|
| 5,254,505 A | 10/1993 | Kamiyama | |
| 5,256,455 A | 10/1993 | Numasawa | |
| 5,261,961 A | 11/1993 | Takasu et al. | |
| 5,270,241 A | 12/1993 | Dennison et al. | |
| 5,312,783 A | 5/1994 | Takasaki et al. | |
| 5,392,189 A | 2/1995 | Fazan et al. | |
| 5,395,771 A | 3/1995 | Nakato | |
| 5,459,635 A | 10/1995 | Tomozawa et al. | |
| 5,468,687 A | 11/1995 | Carl et al. | |
| 5,470,398 A | 11/1995 | Shibuya et al. | |
| 5,525,156 A | 6/1996 | Manada et al. | |
| 5,596,214 A | 1/1997 | Endo | |
| 5,614,018 A | 3/1997 | Azuma et al. | |
| 5,618,761 A | 4/1997 | Eguchi et al. | |
| 5,635,741 A | 6/1997 | Tsu et al. | |
| 5,656,329 A | 8/1997 | Hampden-Smith | |
| 5,663,089 A | 9/1997 | Tomozawa et al. | |
| 5,702,562 A | 12/1997 | Wakahara | |
| 5,711,816 A | 1/1998 | Kirlin et al. | |
| 5,719,417 A | 2/1998 | Roeder et al. | |
| 5,723,361 A | 3/1998 | Azuma et al. | |
| 5,731,948 A | 3/1998 | Yializis et al. | |
| 5,736,759 A | 4/1998 | Haushaalter | |
| 5,776,254 A | 7/1998 | Yuuki et al. | |
| 5,783,253 A | 7/1998 | Roh | |
| 5,798,903 A | 8/1998 | Dhote et al. | |
| 5,834,060 A | 11/1998 | Kawahara et al. | |
| 5,909,043 A | 6/1999 | Summerfelt | |
| 5,972,430 A | 10/1999 | DiMeo, Jr. et al. | |
| 5,976,990 A | 11/1999 | Mercaldi et al. | |
| 5,989,927 A | 11/1999 | Yamonobe | |
| 6,025,222 A | 2/2000 | Kimura et al. | |
| 6,037,205 A | 3/2000 | Huh et al. | |
| 6,043,526 A | 3/2000 | Ochiai | |
| 6,046,345 A | 4/2000 | Kadokura et al. | |
| 6,078,492 A | 6/2000 | Huang et al. | |
| 6,090,443 A | 7/2000 | Eastep | |
| 6,101,085 A | 8/2000 | Kawahara et al. | |
| 6,126,753 A | 10/2000 | Shinriki et al. | |
| 6,127,218 A | 10/2000 | Kang | |
| 6,143,597 A | 11/2000 | Matsuda et al. | |
| 6,143,679 A | 11/2000 | Nagasawa | |
| 6,146,907 A | 11/2000 | Xiang et al. | |
| 6,150,684 A | 11/2000 | Sone | |
| 6,153,898 A | 11/2000 | Watanabe | |
| 6,156,638 A | 12/2000 | Agarwal et al. | |
| 6,165,834 A | 12/2000 | Agarwal et al. | |
| 6,211,096 B1 | 4/2001 | Allman | |
| 6,215,650 B1 | 4/2001 | Gnade et al. | |
| 6,236,076 B1 | 5/2001 | Arita et al. | |
| 6,238,734 B1 | 5/2001 | Senzaki et al. | |
| 6,245,652 B1 | 6/2001 | Gardner et al. | |
| 6,258,170 B1 | 7/2001 | Somekh | |
| 6,258,654 B1 | 7/2001 | Gocho | |
| 6,277,436 B1 | 8/2001 | Stauf et al. | |
| 6,285,051 B1 | 9/2001 | Ueda et al. | |
| 6,287,935 B1 | 9/2001 | Coursey | |
| 6,323,057 B1 | 11/2001 | Sone | |
| 6,325,017 B1 | 12/2001 | DeBoer et al. | |
| 6,335,049 B1 | 1/2002 | Basceri | |
| 6,335,302 B1 | 1/2002 | Satoh | |
| 6,337,496 B2 | 1/2002 | Jung | |
| 6,338,970 B1 | 1/2002 | Suh | |
| 6,362,068 B1 | 3/2002 | Summerfelt | |
| 6,372,686 B1 | 4/2002 | Golden | |
| 6,422,281 B1 | 7/2002 | Ensign Jr. et al. | |
| 6,500,487 B1 | 12/2002 | Holst et al. | |
| 6,507,060 B2 | 1/2003 | Ren et al. | |
| 6,525,365 B1 | 2/2003 | Basceri et al. | |
| 6,527,028 B2 | 3/2003 | Miller | |
| 6,558,517 B2 | 5/2003 | Basceri | |
| 6,566,147 B2 | 5/2003 | Basceri et al. | |
| 6,602,376 B1 | 8/2003 | Bradshaw | |
| 6,727,140 B2 | 4/2004 | Basceri et al. | |
| 6,838,122 B2 | 1/2005 | Basceri et al. | |
| 6,838,293 B2 | 1/2005 | Basceri et al. | |
| 6,878,602 B2 | 4/2005 | Basceri et al. | |
| 6,884,475 B2 * | 4/2005 | Basceri | 427/576 |
| 6,908,639 B2 | 6/2005 | Basceri et al. | |
| 6,952,029 B1 | 10/2005 | Basceri | |
| 6,962,824 B2 | 11/2005 | Basceri et al. | |
| 6,982,103 B2 | 1/2006 | Basceri et al. | |
| 6,995,419 B2 | 2/2006 | Agarwal et al. | |
| 7,005,695 B1 | 2/2006 | Agarwal | |
| 7,011,978 B2 | 3/2006 | Basceri | |
| 7,023,043 B2 | 4/2006 | Basceri et al. | |
| 7,029,985 B2 | 4/2006 | Basceri et al. | |
| 7,073,730 B2 | 7/2006 | Haag et al. | |
| 2002/0197793 A1 | 12/2002 | Dornfest et al. | |
| 2003/0017265 A1 | 1/2003 | Basceri et al. | |
| 2003/0017266 A1 | 1/2003 | Basceri et al. | |
| 2003/0045006 A1 | 3/2003 | Basceri | |

FOREIGN PATENT DOCUMENTS

| | | |
|---|---|---|
| EP | 0306069 | 3/1989 |
| EP | 0388957 | 9/1990 |
| EP | 0474140 | 3/1992 |
| EP | 0810666 | 12/1997 |
| EP | 0835950 | 4/1998 |
| EP | 0855735 | 7/1998 |
| EP | 0892426 | 1/1999 |
| EP | 0957522 | 11/1999 |
| GB | 2194555 | 3/1988 |
| JP | 2250970 | 10/1990 |
| JP | 0424922 | 1/1992 |
| JP | 04115533 | 4/1992 |
| JP | 04180566 | 6/1992 |
| JP | 08-060347 | 3/1996 |
| JP | 2000091333 | 3/2000 |
| WO | 98/39497 | 9/1998 |
| WO | 99/64645 | 12/1999 |
| WO | 01/16395 | 3/2001 |

OTHER PUBLICATIONS

T. T. Arai et al., *Preparation of SrTiO₃ Films on 8-inch Wafers by chemical Vapor Deposition*, JPN, J. Appl. Phys., vol. 35, Pt. 1, No. 9B, pp. 4875-4879 (Sep. 1996).

C. Basceri, PH. D. Dissertation: *Electrical and Dielectric Properties of (Ba,Sr)TiO₃Thin Film Capacitors for . . .* Dept. of Materials Science and Engineering, North Carolina University, Raleigh, NC, 171 pages (1997).

C. Basceri et al., *The dielectric response as a function of temperature and film thickness of fiber-textured (Ba,Sr)TiO₃ thin films grown by chemical . . .*, J. Appl. Phys., 82 (5), pp. 2497-2504 (Sep. 1997).

S. Bilodeau et al., *Composition Dependence of the Dielectric Properties of MOCVD $Ba_xSr_{1-x}TiO_3$*, Advanced Technology Materials, Presented at MRS Fall Meeting, pp. 1-21 (Dec. 1994).

S. M. Bilodeau et al., *MOCVD BST for High Density DRAM Applications*, Published in proceedings of CVD Technologies for Inter-Level Dielectrics and Interconnects symposium at SEMICON/WEST, 2 pages (Jul. 1995).

Y-C Choi et al., *Improvements of the Properties of Chemical-Vapor-Deposited (Ba,Sr)TiO₃ Films Through Use of a Seed Layer*, Jpn. J. Appl. Phys., vol. 36, No. 11, Pt. 1, pp. 6824-6828 (1997).

C.M. Chu et al., *Electrical properties and crystal structure of (Ba,SR)TiO₃ films prepared at low temperatures On a LaNiO₃ electrode by . . .*, Appl. Phys. Lett., vol. 70, No. 2, pp. 249-51 (Jan. 1997).

K. Eguchi et al., *Chemical vapor deposition of (Ba,Sr)TiO₃ thin films for application in gigabit scale dynamic random access memories*, Integrated Ferroelectrics, vol. 14, Nos. 1-4, Pt. 1, pp. 33-42 (1997).

Q. X. Jia et al, *Structural and dielectric properties of $Ba_{0.5}Sr_{0.5}TiO_3$ thin films with an epi-$RuO)_2$ bottom electrode*, Integrated Ferroelectrics, vol. 19, Nos. 1-4, pp. 111-119 (1998).

T. Kawahara et al., *(Ba,SR)liO₃ Films Prepared by Liquid Source Chemical Vapor Deposition on Ru Electrodes*, Jpn. J. Appl. Phys., vol. 35, No. 9B, Pt. 1, pp. 4880-4883 (Sep. 1996).

R. Khamankar et al., *A Novel Low-Temperature Process for High Dielectric Constant BST Thin Films for ULSI DRAM . . .*, Microelectronics Research Center, Univ. of Texas at Austin, TX, 2 pages (pre-May 2000).

Y. T. Kim et al., *Advantages of $RuO_x$ bottom electrode in the dielectric and leakage characteristics of (Ba,Sr)$TiO_3$ capacitor*, Jpn. J. Appl. Phys., vol. 35, No. 12A, pp. 6153-6156 (Dec. 1996).

T. W. Kim et al., *Structural and electicqal properties of $BaTiO_3$ grown on p-InP(100)by low-pressure metal-organic chemical vapor deposition . . .*, Appl. Phys. Lett., vol. 65, No. 15, pp. 1955-1957 (Oct. 1994).

S. H. Paek et al., *Characterization of MIS capacitor of BST thin films deposited on Si by RF magnetron sputtering*, Ferroelectric Thin Films V, Symposium, San Francisco, CA, pp. 33-38 (Apr. 1995).

S. Stemmer et al., *Accommodation of nonsloichiometry in(100)fiber-textured $(Ba_xSr_{1-x})Ti_{1+y}O_{3+z}$ thin films grown by chemical vapor deposition*, Appl. Phys. Lett., vol. 74, No. 17, pp. 2432-2434 (Apr. 1999).

S. K. Streiffer et al., *Ferroelectricity in thin films: The dielectric response of fiber-textured$(Ba_xSr_{1-x})Ti_{1-x}O_{3+z}$thin films grown by chemical vapor deposition*, J. Appl. Phys., vol. 86, No. 8, pp. 4565-4575 (Oct. 1999).

N. Takeuchi et al., *Effect of firing atmosphere on the cubic-hexagonal transition in $Ba_{0.99}Sr_{0.1}TiO_3$* Nippon Seramikkusu Kyokai Gakujutsu Ronbunshi, vol. 98, No. 8, pp. 836-839 (1990).

Valiev et al., *Plastic deformation of alloys with submicron-grained structure*, Materials Science and Engineering, A137, pp. 35-40 (1991).

H. Yamaguchi et al., *Reactive coevaporation synthesis and characterization of $SrTiO_3$-$BaTiO_3$ thin films*, IEEE International Symposium on Applications of Ferroelectrics, Greenville, SC, pp. 285-288 (Aug 1992).

S. Yamamichi et al., *Ba+Sr/Ti ratio dependence of the dielectric properties for$(Ba_{0.5}Sr_{0.5})TiO_3$thin films prepared by ion beam sputtering*, Appl. Phys. Lett. Vol. 64, No. 13, pp. 1644-1646 (Mar. 1994).

M. Yamamuka et al., *Thermal-Desorption Spectroscopy of(Ba,Sr)$TiO_3$Thin-Films Prepared by Chemical-Vapor-Deposition*, Jpn. J. Appl. Phys., vol. 35, No. 2A, Pt. 1, pp. 729-735 (Feb. 1996).

U.S. Appl. No. 09/388,063, dated Aug. 30, 1999.

\* cited by examiner

METHODS OF FORMING A CAPACITOR

This patent application is a continuation application of U.S. patent application Ser. No. 10/875,381, filed Jun. 25, 2004, entitled "Chemical Vapor Deposition Method for Depositing a High K Dielectric Film", naming Cem Basceri as inventor, now U.S. Pat. No. 6,884,475, the disclosure of which is incorporated by reference; and which is a continuation application of U.S. patent application Ser. No. 09/580,733 filed, (now abondoned), filed May 26, 2000, now abandoned entitled "Chemical Vapor Deposition Method for Depositing a High K Dielectric Film" naming Cem Basceri as inventor, the disclosure of which is incorporated by reference.

TECHNICAL FIELD

This invention relates to chemical and physical vapor deposition methods of forming high k $ABO_3$ comprising dielectric layers on a substrate, where "A" is selected from the group consisting of Group IIA and Group IVB elements and mixtures thereof, and where "B" is selected from the group consisting of Group IVA metal elements and mixtures thereof.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256 Mb DRAMs and beyond will be on the order of 0.25 micron or less, and conventional dielectrics such as $SiO_2$ and $Si_3N_4$ might not be suitable because of small dielectric constants.

Highly integrated memory devices, such as 256 Mbit DRAMs, are expected to require a very thin dielectric film for the 3-dimensional capacitor of cylindrically stacked or trench structures. To meet this requirement, the capacitor dielectric film thickness will be below 2.5 nm of $SiO_2$ equivalent thickness.

Insulating inorganic metal oxide materials (such as ferroelectric materials, perovskite materials and pentoxides) are commonly referred to as "high k" materials due to their high dielectric constants, which make them attractive as dielectric materials in capacitors, for example for high density DRAMs and non-volatile memories. In the context of this document, "high k" means a material having a dielectric constant of at least 20. Such materials include tantalum pentoxide, barium strontium titanate, strontium titanate, barium titanate, lead zirconium titanate and strontium bismuth tantalate. Using such materials enables the creation of much smaller and simpler capacitor structures for a given stored charge requirement, enabling the packing density dictated by future circuit design.

One class of high k materials comprises $ABO_3$, where "A" is selected from the group consisting of Group IIA and Group IVB metal elements and mixtures thereof, and where "B" is selected from the group consisting of Group IVA elements and mixtures thereof. Such materials can be deposited by chemical or physical vapor deposition methods.

Certain high k dielectric materials have better current leakage characteristics in capacitors than other high k dielectric materials. In some materials, aspects of a high k material which might be modified or tailored to achieve a highest capacitor dielectric constant possible will unfortunately also tend to hurt the leakage characteristics (i.e., increase current leakage). For example, one class of high k capacitor dielectric materials includes metal oxides having multiple different metals bonded with oxygen, such as the barium strontium titanate, lead zirconium titanate, and strontium bismuth titanate referred to above. For example with respect to barium strontium titanate, it is found that increasing titanium concentration as compared to barium and/or strontium results in improved leakage characteristics, but decreases the dielectric constant. Accordingly, capacitance can be increased by increasing the concentration of barium and/or strontium, but unfortunately at the expense of increasing leakage. Further, absence of titanium in the oxide lattice creates a metal vacancy in such multimetal titanates which can increase the dielectric constant, but unfortunately also increases the current leakage.

SUMMARY

The invention comprises chemical vapor deposition and physical vapor deposition methods of forming high k $ABO_3$ comprising dielectric layers on a substrate, where "A" is selected from the group consisting of Group IIA and Group IVB metal elements and mixtures thereof, and where "B" is selected from the group consisting of Group IVA elements and mixtures thereof. In one implementation, a plurality of precursors comprising A, B and O are fed to a chemical vapor deposition chamber having a substrate positioned therein under conditions effective to deposit a high k $ABO_3$ comprising dielectric layer over the substrate. During the feeding, pressure within the chamber is varied effective to produce different concentrations of B at different elevations in the deposited layer and where higher comparative pressure produces greater concentration of B in the deposited layer.

In one implementation, a subatmospheric physical vapor deposition method of forming a high k $ABO_3$ comprising dielectric layer on a substrate includes providing a sputtering target comprising $ABO_3$ and a substrate to be deposited upon within a physical vapor deposition chamber. A sputtering gas is fed to the chamber under conditions effective to sputter the target and deposit a high k $ABO_3$ comprising dielectric layer over the substrate. During the feeding, pressure is varied within the chamber effective to produce different concentrations of B at different elevations in the deposited layer and where higher comparative pressure produces greater concentration of B in the deposited layer.

BRIEF DESCRIPTION OF THE DRAWINGS

Preferred embodiments of the invention are described below with reference to the following accompanying drawings.

FIG. 7 is a schematic diagram of an alternate exemplary system usable in accordance with an aspect of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The prior art recognizes the desirability in certain instances of fabricating high k dielectric regions of capacitors, such as $ABO_3$ layers as referred to above, to have variable concentration at different elevational locations in the thickness of such regions of the "A" and "B" components. For example with respect to titanates, the quantity of titanium represented by the variable "B" in $ABO_3$ is impacting relative to leakage current characteristics and k value in the subject layer. Accordingly in some instances, it might be desirable to fabricate a capacitor dielectric region to have one elevational range of one $ABO_3$ stoichiometry, and another elevational range of the region to have a different $ABO_3$ stoichiometry, utilizing the same or different combinations of elements. Further, film morphology and haze can be affected by the concentration of B in the deposited film. The typical prior art method of providing variable stoichiometry at selected locations throughout the thickness of a high k dielectric region is to vary the precursor flows to the reactor during a chemical vapor deposition which may or may not be plasma enhanced.

For example where higher titanium content is desired, the flow rate of the titanium precursor(s) would typically be increased relative to the other precursors. Likewise in this example where less titanium is desired, the flow rate of the titanium precursor(s) would be reduced to achieve lower titanium content in a desired portion of a depositing high k dielectric region. Unfortunately, changing the precursor flows as described does not typically result in a near instantaneous change in titanium concentration in the deposited layer. Accordingly, there is a stabilization problem in varying precursor flows, and a corresponding lag in formation of the selected stoichiometry material.

It has, however, been surprisingly discovered that varying ambient pressure within the chamber during a chemical vapor deposition produces rapid change, stabilization and control in achieving a desired stoichiometry of a high k $ABO_3$ comprising dielectric layer on a substrate. In but one implementation, the invention contemplates a chemical vapor deposition method of forming a high k $ABO_3$ comprising dielectric layer on a substrate, where "A" is selected from the group consisting of Group IIA and Group IVB metal elements and mixtures thereof, and where "B" is selected from the group consisting of Group IVA elements and mixtures thereof. In the context of this document, Group IIA metal elements consist of Be, Mg, Ca, Sr, Ba, and Ra. Group IVB metal elements consist of Ti, Zr, Hf, and Rf. Group IVA elements consist of Sn and Pb. In accordance with but one aspect of the invention, a plurality of precursors comprising A, B and O are fed to a chemical vapor deposition chamber having a substrate positioned therein under conditions effective to deposit a high k $ABO_3$ comprising dielectric layer over the substrate. During the feeding, pressure is varied within the chamber effective to produce different concentrations of B at different elevations in the deposited layer, and where higher comparative pressure produces greater concentration of B in the deposited layer.

Figure 1:
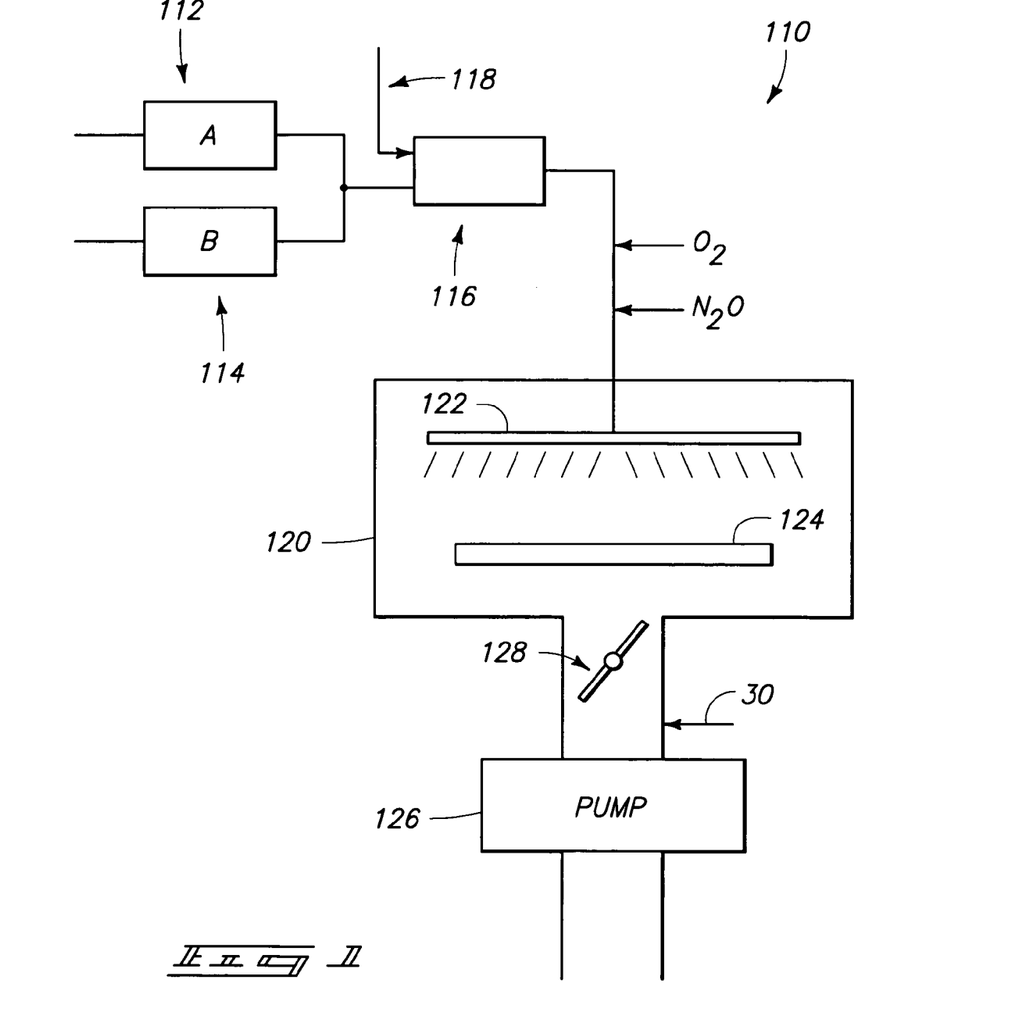
FIG. 1 is a schematic diagram of an exemplary system usable in accordance with an aspect of the invention.

FIG. 1 diagrammatically illustrates but one chemical vapor deposition system 110 in accordance with but one implementation of a chemical vapor deposition method in accordance with the invention. Such comprises an A precursor feed stream 112 and a B precursor feed stream 114. Such combine and feed to a vaporizer 116. An inert gas stream 118 can be provided also to vaporizer 116 to facilitate flow of the vaporized precursors to a downstream chamber.

A chemical vapor deposition chamber 120 is connected downstream of vaporizer 116. Such includes a showerhead 122 for receiving and distributing gaseous precursors therein. A suitable wafer holder 124 is received within chamber 120. Oxidizer gas feed streams, for example one or more $O_2$ and $N_2O$ streams, are preferably provided upstream of the showerhead. The deposition is preferably conducted at subatmospheric pressure, with a vacuum pump 126 being diagrammatically illustrated for achieving a desired vacuum pressure within chamber 120. In the most preferred implementation, the vacuum pressure during deposition is varied at least one point during the deposition by manipulating some vacuum pressure control device associated with chamber 120 to produce desired different concentrations of B at different elevations in the deposited layer. By way of example only, such pressure control device might include the illustrated vacuum pressure control valve 128 provided proximate chamber 120. Alternately by way of example only, such manipulating might comprise changing upstream ballast flow to vacuum pump 126 downstream of chamber 120, such as represented by arrow 30. For a given vacuum pump speed, addition of ballast control gas through line 30 will decrease the degree of vacuum achieved within chamber 120 for increasing flows of ballast gas, assuming constant vacuum pump speed. Further by way of example only, such manipulating of a control device to control vacuum pressure within the chamber might comprise changing the speed of vacuum pump 126. Such manipulation of vacuum pressure by actuating a direct controlling device associated with the chamber is most preferred in accordance with the invention as enabling rapid control of ambient pressure and changes associated therewith within chamber 120.

Further most preferably in a process in accordance with but one aspect of the invention, the flows of the precursors are maintained substantially constant while pressure is varied. Even more preferably, with the exception of pressure, all of the conditions of deposition are maintained substantially constant throughout deposition of the layer on the substrate. The deposition may or may not be plasma enhanced.

In one example, A in the high k ABO3 comprising dielectric layer consists essentially of a mixture of Ba and Sr (i.e., preferably about 50%–50%), and B consists essentially of Ti. Example preferred deposition is by metal organic chemical vapor deposition (MOCVD) processes, with one or more oxidizers being provided within chamber 120 with suitable MOCVD precursors to deposit a desired barium strontium titanate or other film on a substrate. Example oxidizers include either 100% $O_2$ or a 50—50 mix of $O_2$ and $N_2O$. Alternate preferred processing can occur in accordance with my co-pending U.S. patent application Ser. No. 09/476, 516, filed on Jan. 3, 2000, entitled "Chemical Vapor Deposition Methods Of Forming A High K Dielectric Layer And Methods Of Forming A Capacitor", listing Cem Basceri as inventor, which is hereby incorporated by reference.

By way of example only, other example preferred high k dielectric materials in addition to barium strontium titanate, include

| | |
|---|---|
| SrTiO₃ | ST |
| BaTiO₃ | BT |
| Pb(Zr,Ti)O₃ | PZT |
| BaZrO₃ | BZT |

For deposition of BST, example precursors, and by way of example only, include:

| | |
|---|---|
| Ba(thd)₂ | bis(tetramethylheptanedionate) |
| Sr(thd)₂ | bis(tetramethylheptanedionate) |
| Ti(thd)₂(O-i-Pr)₂ | (isopropoxide)bis(tetramethylheptanedionate) |
| Ba(thd)₂ | bis(tetramethylheptanedionate) |
| Sr(thd)₂ | bis(tetramethylheptanedionate) |
| Ti(dmae)₄ | bis(dimethylaminoethoxide) |
| Ba(methd)₂ | bis(methoxyethoxyte, tetramethylheptanedionate) |
| Sr(methd)₂ | bis(methoxyethoxyte, tetramethylheptanedionate) |
| Ti(mpd)(thd)₂ | bis(methylpentanediol, tetramethylheptanedionate) |
| Ba(dpm)₂ | bis(dipivaloylmethanato) |
| Sr(dpm)₂ | bis(dipivaloylmethanato) |
| TiO(dpm)₂ | (titanyl)bis(dipivaloylmethanato) |
| Ba(dpm)₂ | bis(dipivaloylmethanato) |
| Sr(dpm)₂ | bis(dipivaloylmethanato) |
| Ti(t-BuO)₂(dpm)₂ | (t-butoxy)bis(dipivaloylmethanato) |
| Ba(dpm)₂ | bis(dipivaloylmethanato) |
| Sr(dpm)₂ | bis(dipivaloylmethanato) |
| Ti(OCH₃)₂(dpm)₂ | (methoxy)bis(dipivaloylmethanato) |

Adducts (i.e., tetraglyme, trietherdiamine, pentamethyldiethylenetriamine), solvents (i.e., butylacetate, methanol, tetrahydrofuran), and/or other materials might be utilized with the precursors.

By way of example only, and where the precursors include metal organic precursors, example flow rates for the various of such precursors include anywhere from 10 mg/min. to 1000 mg/min. of liquid feed to any suitable vaporizer. Preferred N₂O flows include from 100 sccm to 4000 sccm, more preferably between 500 sccm and 2000 sccm, and most preferably between 750 sccm and 1250 sccm. Such flow rates and reduction-to-practice of the invention are with respect to an Applied Materials Centura Frame™ processor. A preferred pressure range is from 100 mTorr to 20 Torr, with a range of from 1 Torr to 6 Torr being more preferred. Susceptor temperature is preferably from 100° C. to 700° C., more preferably from 400° C. to 700° C., with less than or equal to 550° C. being even more preferred and in attaining continuity in the deposited layer at thicknesses at or below 200 Angstroms, and preferably at least down to 50 Angstroms. Most preferably, susceptor temperature is kept at less than or equal to 550° C. during all of the deposit to form layer 16.

Figure 2:
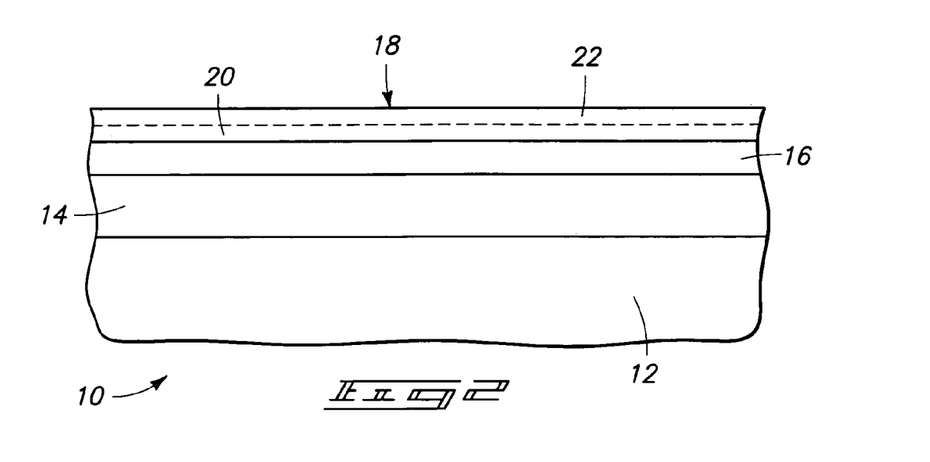
FIG. 2 is a diagrammatic sectional view of a semiconductor wafer fragment in process in accordance with an aspect of the invention.

The varying of pressure within the chamber during the deposition might be conducted in a number of different manners depending upon the finished composition the fabricator desires. By way of example only, three possible exemplary implementations are described with reference to FIGS. 2–4. FIG. 2 depicts an exemplary substrate 10 comprising a bulk monocrystalline silicon substrate 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An insulative layer 14, such as borophosphosilicate glass (BPSG), is formed over substrate 12. A conductive capacitor electrode layer 16, such as platinum or an alloy thereof by way of example only, is formed over layer 14. A high k ABO₃ comprising dielectric layer 18 is formed thereover in accordance with some aspect of the invention. In this exemplary depicted example, a plurality of precursors comprising A, B and O are fed to a chemical vapor deposition chamber under some suitable first set of conditions effective to deposit a substantially homogenous first portion 20 of high k ABO₃ comprising dielectric layer 18. The first conditions in this example are preferably characterized at least by some substantially constant first pressure.

While feeding the plurality of precursors, the first conditions are changed to second conditions that at least include a substantially constant second pressure which is different from the first pressure effective to deposit a substantially homogenous second portion 22 of high k ABO₃ comprising dielectric layer 18 on first portion 20. First portion 20 and second portion 22 have different concentrations of B, and where higher comparative pressure produces greater concentration of B in either portion 20 or 22. As with the above-described generic description, with the exception of pressure, preferably all parameters of all of the first and second conditions are substantially the same throughout deposition of the first and second portions on the substrate. Preferably in this one example implementation, a change in deposition pressure occurs over a time interval of less than or equal to 5 seconds, and thereby produces deposited layer 18 to have the illustrated two distinct portions 20 and 22 characterized by different substantially constant concentrations of B. Again preferably, and by way of example only, pressure control is preferably accomplished by manipulating a vacuum pressure control device associated with the deposition chamber, for example the control devices illustrated in FIG. 1.

Figure 3:
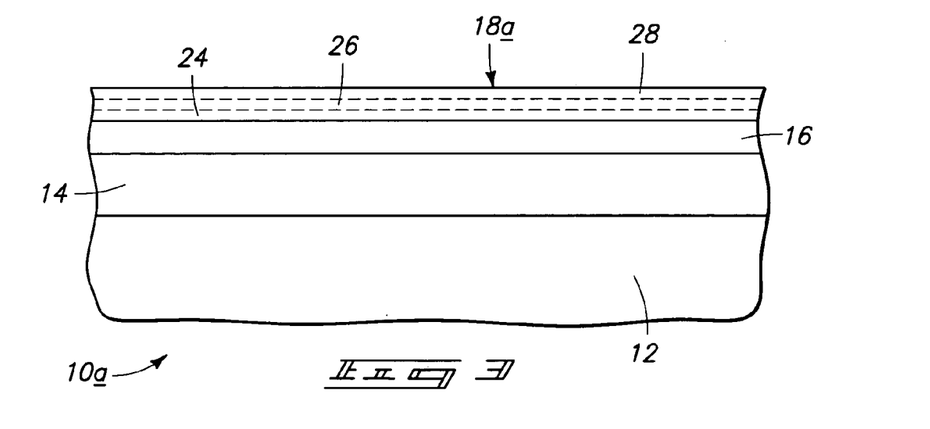
FIG. 3 is a diagrammatic sectional view of an alternate embodiment semiconductor wafer fragment in process in accordance with an aspect of the invention.

FIG. 3 illustrates an alternate embodiment wafer fragment 10a. Like numerals from the first described embodiment are utilized where appropriate, with differences being indicated with the suffix "a" or with different numerals. FIG. 3 depicts a high k ABO₃ comprising dielectric layer 18a formed by pressure changes occurring in multiple discrete steps, thereby producing deposited layer 18a to have three portions 24, 26 and 28. Such portions are characterized by at least two different substantially constant concentrations of B. For example, pressure during formation of regions 24 and 28 might be the same, with the pressure during formation of region 26 being different. Alternately by way of example only, different substantially constant pressures might be utilized in formation of each of the three illustrated layers, and thereby producing three different substantially constant concentrations of B in layer 18.

The invention also contemplates producing any of the above or other constructions in a manner whereby something other than discrete, short time interval pressure change occurs. In accordance with one implementation of the invention, during at least some of the feeding, pressure within the chamber is continuously varied effective to produce a gradient in concentration of B across at least a portion (preferably a majority portion) of the thickness of the deposited layer, and where higher comparative pressure produces greater concentration of B in the deposited layer.

Figure 5:
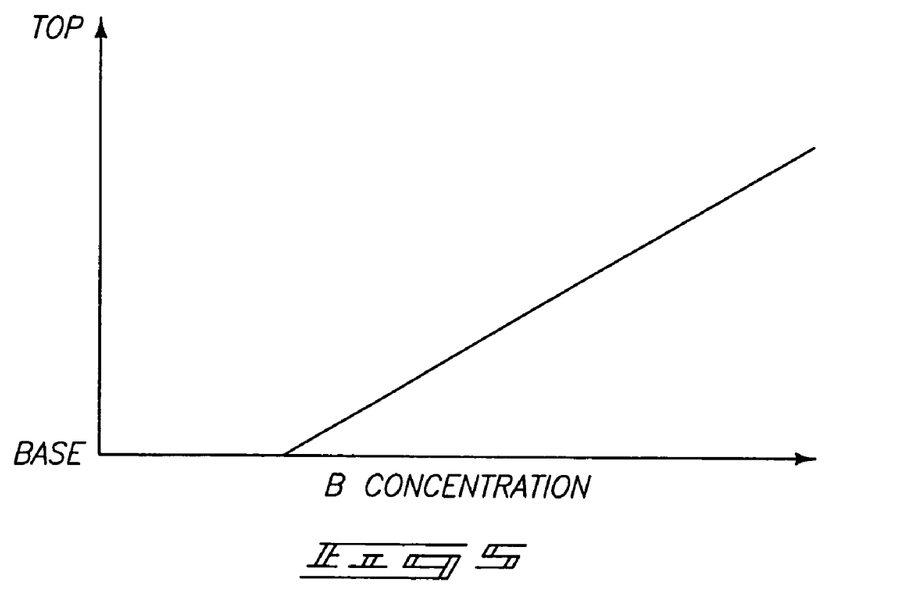
FIG. 5 is a graph representing B concentration as function of thickness in accordance with an aspect of the invention.
Figure 6:
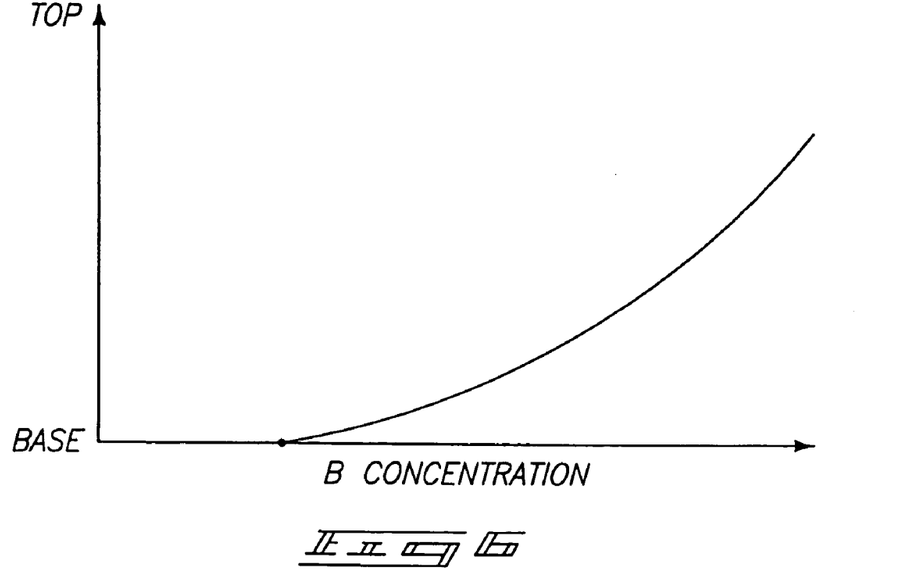
FIG. 6 is a graph representing B concentration as function of thickness in accordance with an alternate aspect of the invention.

A construction produced from such an exemplary process is described with reference to FIG. 4 in connection with a substrate 10b. Like numerals from the first described embodiment are utilized where appropriate, with differences being indicated with the suffix "b" or with different numerals. Variable concentration of B in the illustrated layer 18b is depicted by the increasing density across an increasing gradient from low to high of the illustrated dots or peppering of the illustrated layer 18b. A continuously varying of pressure might be conducted to produce a substantially constant concentration change of B per unit thickness across the portion of the thickness, as exemplified by the FIG. 5 graphical representation. Alternately by way of example only, a continuously varying of pressure might be conducted to produce variable concentration changes of B across the portion of the thickness where the continuous varying of pressure occurs. FIG. 6 illustrates such an example where the concentration of B does not change along a straight line, and is thereby not a constant change across the thickness.

Figure 4:
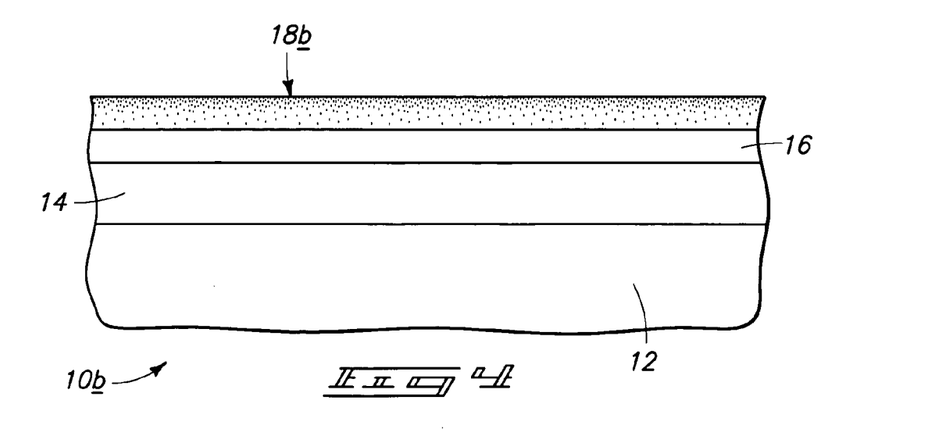
FIG. 4 is a diagrammatic sectional view of another alternate embodiment semiconductor wafer fragment in process in accordance with an aspect of the invention.

FIG. 4 also illustrates the entirety of the thickness of layer 18b having been processed to produce variable B concentration throughout the entirety of the layer. Alternately, only a majority or some smaller portion might be produced to have a non-homogeneous construction. Further, and by way of example only, any of the example FIG. 2 and FIG. 3 constructions might be processed to include some portion which includes a concentration gradient thereacross. Preferably in accordance with this aspect of the invention, the pressure varying occurs over a time interval of at least 20 seconds, and thereby produces the deposited layer to have at least one portion characterized by a gradient in concentration of B thereacross.

The invention also has applicability in subatmospheric physical vapor deposition methods. FIG. 7 diagrammatically illustrates a physical vapor deposition system 50 utilizable in accordance with this aspect of the invention. Like numerals from the first described embodiment are utilized where appropriate, with differences being indicated with different numerals. A suitable sputtering target 54 comprising $ABO_3$ in accordance with the above is positioned within a physical vapor deposition chamber 52. A wafer 56 is received over a wafer support 58 within chamber 52. A suitable sputtering gas, preferably Ar, is fed to chamber 52 from a source 60 under conditions effective to sputter target 54 and deposit a high k $ABO_3$ comprising dielectric layer over substrate 56. During the feeding, pressure is varied within chamber 52 effective to produce different concentrations of B at different elevations in the deposited layer and where higher comparative pressure produces greater concentration of B in the deposited layer, analogous to the first described embodiments. By way of example only, one sputtering system includes RF magnetron sputtering. Example preferred temperatures during the processing include wafer temperatures of from 400° C. to 650° C. Pressure is varied preferably between 1 mTorr and 300 mTorr. Bias power to the target preferably ranges at from 1 to 5 W/cm² of target area. Exemplary RF power is from 10 to 200 watts. Sputtering gas can be either argon or a mixture of argon and oxygen, or any other appropriate sputtering gas. An exemplary flow rate for each of argon and oxygen in a preferred 1 to 1 ratio flow is from 100 sccm to 5000 sccm each.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a capacitor having a capacitor dielectric layer comprising $ABO_3$, where "A" is selected from the group consisting of Group IIA and Group IVB metal elements and mixtures thereof, where "B" is selected from the group consisting of Group IVA elements and mixtures thereof, the method comprising:
   feeding a plurality of precursors comprising A, B and O to a chamber having a substrate positioned therein under conditions effective to chemical vapor deposit an $ABO_3$-comprising dielectric layer over the substrate;
   during the feeding, varying pressure within the chamber effective to produce different concentrations of B at different elevations in the deposited layer and where higher comparative pressure produces greater concentration of B in the deposited layer; and
   incorporating the $ABO_3$-comprising dielectric layer into a capacitor, the $ABO_3$-comprising dielectric layer comprising a capacitor dielectric layer of the capacitor and having a dielectric constant k of at least 20 in the capacitor.

2. The method of claim 1 wherein A consists essentially of a mixture of Ba and Sr.

3. The method of claim 1 wherein B consists essentially of Ti.

4. The method of claim 1 wherein A consists essentially of a mixture of Ba and Sr, and B consists essentially of Ti.

5. The method of claim 1 wherein flows of the precursors are maintained substantially constant while varying the pressure.

6. The method of claim 1 wherein, with the exception of pressure, all of the conditions are maintained substantially constant throughout deposition of the layer on the substrate.

7. The method of claim 1 wherein the deposition is plasma enhanced.

8. The method of claim 1 wherein the deposition is not plasma enhanced.

9. The method of claim 1 wherein varying the pressure occurs over a time interval of less than or equal to 5 seconds, and thereby produces the deposited layer to have at least two distinct portions characterized by different substantially constant concentrations of B.

10. The method of claim 1 wherein varying the pressure occurs over a time interval of at least 20 seconds, and thereby produces the deposited layer to have at least one portion characterized by a gradient in concentration of B.

11. The method of claim 1 wherein the varying occurs in multiple discrete steps thereby producing the deposited layer to have at least three portions characterized by at least two different substantially constant concentrations of B.

12. The method of claim 1 wherein the varying occurs in multiple discrete steps thereby producing the deposited layer to have at least three portions characterized by at least three different substantially constant concentrations of B.

13. The method of claim 1 wherein the deposition is subatmospheric.

14. The method of claim 1 wherein the substrate comprises a semiconductor substrate.

15. A method of forming a capacitor having a capacitor dielectric layer comprising $ABO_3$, where "A" is selected from the group consisting of Group IIA and Group IVB metal elements and mixtures thereof, where "B" is selected from the group consisting of Group IVA elements and mixtures thereof, the method comprising:

feeding a plurality of precursors comprising A, B and O to a chamber having a substrate positioned therein under conditions effective to chemical vapor deposit a an $ABO_3$-comprising dielectric layer over the substrate;

during at least some of the feeding, continuously varying pressure within the chamber effective to produce a gradient in concentration of B across at least a majority portion of the thickness of the deposited layer and where higher comparative pressure produces greater concentration of B in the deposited layer; and incorporating the $ABO_3$-comprising dielectric layer into a capacitor, the $ABO_3$-comprising dielectric layer comprising a capacitor dielectric layer of the capacitor and having a dielectric constant k of at least 20 in the capacitor.

16. The method of claim 15 comprising continuously varying pressure during a majority of the deposition of the layer on the substrate.

17. The method of claim 15 comprising continuously varying pressure throughout deposition of the layer on the substrate.

18. The method of claim 15 wherein the continuously varying of pressure is conducted to produce a substantially constant concentration change of B per unit thickness across said portion of the thickness.

19. The method of claim 15 wherein the continuously varying of pressure is conducted to produce variable concentration changes of B across said portion of the thickness.

20. The method of claim 15 wherein flows of the precursors are maintained substantially constant while varying the pressure.

21. The method of claim 15 wherein, with the exception of pressure, all of the conditions are maintained substantially constant throughout deposition of the layer on the substrate.

22. The method of claim 15 wherein the deposition is subatmospheric, and the varying of pressure occurs by manipulating a vacuum pressure control device associated with the chamber.

23. The method of claim 15 wherein the substrate comprises a semiconductor substrate.

24. A method of forming a capacitor having a capacitor dielectric layer comprising $ABO_3$, where "A" is selected from the group consisting of Group IIA and Group IVB metal elements and mixtures thereof, where "B" is selected from the group consisting of Group IVA elements and mixtures thereof, the method comprising:

feeding a plurality of precursors comprising A, B and O to a chamber having a substrate positioned therein under first conditions effective to chemical vapor deposit a substantially homogenous first portion of an $ABO_3$-comprising dielectric layer over the substrate, the first conditions comprising a substantially constant first pressure;

while feeding the plurality of precursors, changing the first conditions to second conditions that at least include a substantially constant second pressure which is different from the first pressure effective to deposit a substantially homogenous second portion of the $ABO_3$-comprising dielectric layer on the first portion, the first and second portions having different concentrations of B and where higher comparative pressure produces greater concentration of B; and incorporating the $ABO_3$-comprising dielectric layer into a capacitor, the $ABO_3$-comprising dielectric layer comprising a capacitor dielectric layer of the capacitor and having a dielectric constant k of at least 20 in the capacitor.

25. The method of claim 24 wherein flows of the precursors are maintained substantially constant during the first and second conditions.

26. The method of claim 24 wherein, with the exception of pressure, parameters of all of the first and second conditions are substantially the same throughout deposition of the first and second portions on the substrate.

27. The method of claim 24 wherein A consists essentially of a mixture of Ba and Sr.

28. The method of claim 24 wherein B consists essentially of Ti.

29. The method of claim 24 wherein A consists essentially of a mixture of Ba and Sr, and B consists essentially of Ti.

30. The method of claim 24 wherein the deposition is subatmospheric, and the varying of pressure occurs by manipulating a vacuum pressure control device associated with the chamber.

31. The method of claim 24 wherein the substrate comprises a semiconductor substrate.

32. A method of forming a-capacitor having a capacitor dielectric layer comprising $ABO_3$, where "A" is selected from the group consisting of Group IIA and Group IVB metal elements and mixtures thereof, where "B" is selected from the group consisting of Group IVA elements and mixtures thereof, the method comprising:

feeding a plurality of precursors comprising A, B and O to a chamber having a substrate positioned therein under subatmospheric pressure conditions effective to deposit an $ABO_3$-comprising dielectric layer over the substrate;

during the feeding, manipulating a vacuum pressure control device associated with the chamber to change subatmospheric deposition pressure within the chamber effective to produce different concentrations of B at different elevations in the deposited layer and where higher comparative pressure produces greater concentration of B in the deposited layer; and incorporating the $ABO_3$-comprising dielectric layer into a capacitor, the $ABO_3$-comprising dielectric layer comprising a capacitor dielectric layer of the capacitor and having a dielectric constant k of at least 20 in the capacitor.

33. The method of claim 32 wherein the manipulating comprises changing a setting of a pressure control valve proximate the chamber.

34. The method of claim 32 wherein the manipulating comprises changing speed of a vacuum pump.

35. The method of claim 32 wherein the manipulating comprises changing ballast flow to a vacuum pump downstream of the chamber.

36. The method of claim 32 wherein flows of the precursors are maintained substantially constant throughout deposition of the layer on the substrate.

37. The method of claim 32 wherein, with the exception of pressure, all of the conditions are maintained substantially constant throughout deposition of the layer on the substrate.

38. The method of claim 32 wherein change in deposition pressure occurs over a time interval of less than or equal to 5 seconds, and thereby produces the deposited layer to have at least two distinct portions characterized by different substantially constant concentrations of B.

39. The method of claim 32 wherein change in deposition pressure occurs over a time interval of at least 20 seconds, and thereby produces the deposited layer to have at least one portion characterized by a gradient in concentration of B.

40. The method of claim 32 comprising multiple discrete manipulatings thereby producing the deposited layer to have at least three portions characterized by at least two different substantially constant concentrations of B.

41. The method of claim 32 comprising multiple discrete manipulatings thereby producing the deposited layer to have at least three portions characterized by at least three different substantially constant concentrations of B.

42. The method of claim 32 wherein the substrate comprises a semiconductor substrate.

\* \* \* \* \*

UNITED STATES PATENT AND TRADEMARK OFFICE
CERTIFICATE OF CORRECTION

PATENT NO. : 7,217,617 B2  Page 1 of 1
APPLICATION NO. : 11/112127
DATED : May 15, 2007
INVENTOR(S) : Basceri

It is certified that error appears in the above-identified patent and that said Letters Patent is hereby corrected as shown below:

In column 9, line 9, in Claim 15, after "deposit" delete "a".

In column 10, line 30, in Claim 32, delete "a-capacitor" and insert -- a capacitor --, therefor.

Signed and Sealed this

Twenty-fifth Day of March, 2008

JON W. DUDAS
*Director of the United States Patent and Trademark Office*